United States Patent
Dutta et al.

(10) Patent No.: US 11,158,786 B2
(45) Date of Patent: Oct. 26, 2021

(54) MRAM DEVICE FORMATION WITH CONTROLLED ION BEAM ETCH OF MTJ

(71) Applicant: International Business Machines Corporation, Armonk, NY (US)

(72) Inventors: Ashim Dutta, Menands, NY (US); Chih-Chao Yang, Glenmont, NY (US); Lijuan Zou, Slingerlands, NY (US); John Arnold, North Chatham, NY (US)

(73) Assignee: International Business Machines Corporation, Armonk, NY (US)

( * ) Notice: Subject to any disclaimer, the term of this patent is extended or adjusted under 35 U.S.C. 154(b) by 27 days.

(21) Appl. No.: 16/582,762

(22) Filed: Sep. 25, 2019

(65) Prior Publication Data

US 2021/0091306 A1    Mar. 25, 2021

(51) Int. Cl.
*H01L 43/12* (2006.01)
*H01L 43/10* (2006.01)
*H01L 43/02* (2006.01)
*H01L 27/22* (2006.01)

(52) U.S. Cl.
CPC ............ *H01L 43/12* (2013.01); *H01L 27/222* (2013.01); *H01L 43/02* (2013.01); *H01L 43/10* (2013.01)

(58) Field of Classification Search
CPC ....... H01L 27/222; H01L 43/12; H01L 43/10; H01L 43/02
See application file for complete search history.

(56) References Cited

U.S. PATENT DOCUMENTS

| | | | |
|---|---|---|---|
| 4,358,338 A | 11/1982 | Downey et al. | |
| 6,641,747 B1 | 11/2003 | Lukanc et al. | |
| 10,043,851 B1 | 8/2018 | Shen et al. | |
| 10,134,605 B2 | 11/2018 | Guha | |
| 10,833,258 B1 * | 11/2020 | Dutta | G11C 11/161 |

(Continued)

FOREIGN PATENT DOCUMENTS

WO    WO2018139276 A1    8/2018

OTHER PUBLICATIONS

IBM, Barbee et al. "RIE Etch End Point Detector for Variably Doped Silicon: Optical Spectrometer" TDB 06-81 p. 441 IPCOM000052507D Feb. 11, 2005 (2 pages).

(Continued)

*Primary Examiner* — Quoc D Hoang
(74) *Attorney, Agent, or Firm* — L. Jeffrey Kelly; Michael J. Chang, LLC

(57) ABSTRACT

Controlled IBE techniques for MRAM stack patterning are provided. In one aspect, a method of forming an MRAM device includes: patterning an MRAM stack disposed on a dielectric into individual memory cells using IBE landing on the dielectric while dynamically adjusting an etch time to compensate for variations in a thickness of the MRAM stack, wherein each of the memory cells includes a bottom electrode, an MTJ, and a top electrode; removing foot flares from the bottom electrode of the memory cells which are created during the patterning of the MRAM stack; removing residue from sidewalls of the memory cells which includes metal redeposited during the patterning of the MRAM stack and during the removing of the foot flares; and covering the memory cells in a dielectric encapsulant. An MRAM device is also provided.

15 Claims, 6 Drawing Sheets

(56) References Cited

U.S. PATENT DOCUMENTS

| | | | |
|---|---|---|---|
| 2015/0263273 A1* | 9/2015 | Yoshikawa | H01L 27/228 257/295 |
| 2016/0211156 A1 | 7/2016 | Singh et al. | |
| 2018/0033957 A1 | 2/2018 | Zhang et al. | |
| 2018/0301622 A1 | 10/2018 | Kubo et al. | |

OTHER PUBLICATIONS

IBM "New EPD (End Point Detection) method of etching amount control" IPCOM000013441D Jun. 18, 2003 (4 pages).

English translation of WO2018139276 A1, Aug. 2, 2018 by Ando et al. (11 pages).

Veeco, Stand-alone ion beam etch system with low cost of ownership and highest quality etch attributes, accessed Sep. 25, 2019 (4 pages).

* cited by examiner

MRAM DEVICE FORMATION WITH CONTROLLED ION BEAM ETCH OF MTJ

FIELD OF THE INVENTION

The present invention relates to magnetic random access memory (MRAM) devices, and more particularly, to controlled ion beam etch (IBE) techniques for MRAM stack patterning with dynamically adjusted etch time to compensate for variations in stack thickness.

BACKGROUND OF THE INVENTION

Magnetic random access memory (MRAM) devices employ a magnetic tunnel junction (MTJ) to store information. An MTJ includes a fixed magnetic metal layer(s) separated from a free magnetic metal layer(s) by a tunnel barrier. The orientation of the free magnetic layer(s) relative to that of the fixed magnetic layer(s) is used to store the information, e.g., as a logic "1" or logic "0."

MTJs are formed by first depositing the various layers of the MTJ as a stack. The layers are then patterned into individual memory cells using a process such as ion beam etching (IBE).

Controlling the etch time is an important factor for IBE of an MTJ. For instance, a shorter etch time can result in shorting of adjacent cells due to underetch. On the other hand, the patterning process redeposits the metals along the device sidewall, whereby a longer etch time (overetch) redeposits more metal on the junction sidewall which can increase the risk of shorting across the junction.

Unfortunately, conventional IBE with timed etch steps cannot compensate for any incoming stack thickness variations. Thus, incoming stack thickness variations inevitably lead to the underetch/overetch shorts described above.

Accordingly, techniques for controlled IBE of an MTJ that accounts for incoming device thickness variation would be desirable.

SUMMARY OF THE INVENTION

The present invention provides techniques for controlled ion beam etch (IBE) techniques for magnetic random access memory (MRAM) stack patterning with dynamically adjusted etch time to compensate for variations in stack thickness. In one aspect of the invention, a method of forming an MRAM device is provided. The method includes: patterning an MRAM stack disposed on a dielectric into individual memory cells using ion beam etching (IBE) landing on the dielectric while dynamically adjusting an etch time to compensate for variations in a thickness of the MRAM stack, wherein each of the memory cells as-patterned includes a bottom electrode disposed on the dielectric, a magnetic tunnel junction (MTJ) disposed on the bottom electrode, and a top electrode disposed on the MTJ; removing foot flares from the bottom electrode of the memory cells, wherein the foot flares are created during the patterning of the MRAM stack; removing residue from sidewalls of the memory cells, wherein the residue includes metal redeposited during the patterning of the MRAM stack and during the removing of the foot flares; and covering the memory cells in a dielectric encapsulant.

In another aspect of the invention, another method of forming an MRAM device is provided. The method includes: patterning an MRAM stack disposed on an Si-containing dielectric into individual memory cells using IBE landing on the dielectric while dynamically adjusting an etch time to compensate for variations in a thickness of the MRAM stack by monitoring an optical emission signal while the MRAM stack is being patterned, and endpointing the IBE when a change in the optical emission signal is detected corresponding to an optical emission wavelength of Si, wherein each of the memory cells as-patterned includes a bottom electrode disposed on the Si-containing dielectric, an MTJ disposed on the bottom electrode, and a top electrode disposed on the MTJ; removing foot flares from the bottom electrode of the memory cells, wherein the foot flares are created during the patterning of the MRAM stack; removing residue from sidewalls of the memory cells, wherein the residue includes metal redeposited during the patterning of the MRAM stack and during the removing of the foot flares; and covering the memory cells in a dielectric encapsulant.

In yet another aspect of the invention, an MRAM device is provided. The MRAM device includes: individual memory cells patterned on an Si-containing dielectric, wherein each of the memory cells includes a bottom electrode disposed on the Si-containing dielectric, an MTJ disposed on the bottom electrode, and a top electrode disposed on the MTJ; an encapsulant disposed along sidewalls of the memory cells; and an ILD covering the memory cells.

A more complete understanding of the present invention, as well as further features and advantages of the present invention, will be obtained by reference to the following detailed description and drawings.

DETAILED DESCRIPTION OF PREFERRED EMBODIMENTS

Figure 1A:
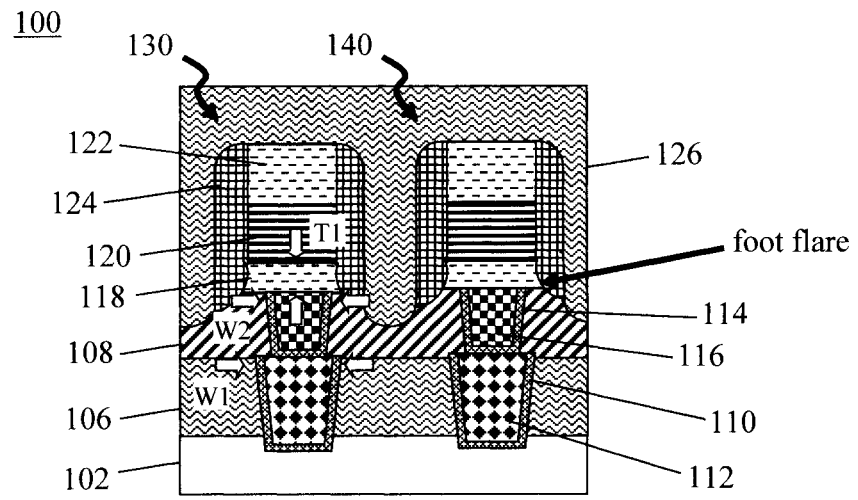
FIG. 1A is a cross-sectional diagram illustrating an exemplary magnetic random access memory (MRAM) device with a thick bottom electrode according to an embodiment of the present invention.

As provided above, conventional approaches for magnetic random access memory (MRAM) fabrication cannot compensate for incoming stack thickness variations. The result can be underetching or overetching, either of which can undesirably lead to shorts.

Advantageously, provided herein are techniques for MRAM stack patterning that employ a controlled ion beam etch (IBE) with endpoint detection to dynamically adjust the IBE etch time depending on the incoming MRAM stack thickness and variations thereof. As will be described in detail below, according to an exemplary embodiment a main IBE etch of the MRAM stack is performed landing on the dielectric underneath with optical emission signal tracking for endpoint detection. That way, underetching or overetching of stacks with incoming thickness variations can be avoided.

For instance, MRAM device fabrication generally involves first depositing the layers of the device as a stack onto a dielectric substrate. For instance, the stack can include a bottom electrode disposed on the dielectric, a magnetic tunnel junction (MTJ) disposed on the bottom electrode, and a top electrode disposed on the MTJ. Each of these layers can include a variety of different metals (see below).

A lithography and etching process is then used to pattern the stack into individual memory cells. An etching process such as IBE landing on the dielectric underneath can be used for the stack etch. IBE is a non-reactive etching process that relies on sputter-induced material removal using high energy ions of noble gases. IBE is typically carried out in a vacuum chamber (e.g., having a pressure of from about $1.0 \times 10^{-4}$ Ton to about $1.0 \times 10^{-6}$ Ton and ranges therebetween) that protects the workpiece from exposure to the ambient environment.

In practice, some variation in the thickness of the layers deposited on the stack is to be expected. For instance, the thickness of a given layer(s) in the stack can vary from one production wafer to another (inter-wafer variation) and/or within the same wafer (intra-wafer variation), i.e., the thickness of a given layer(s) is not uniform across the wafer. If one were to simply employ a fixed timed etch to pattern the stack, then the viability of the end product will depend on the thickness of the incoming layers in the stack. Take for instance the bottom electrode. For stacks where the bottom electrode layer is thicker, a shorter etch time might not fully permeate the bottom electrode layer resulting in shorts between adjacent memory cells. The etch time can be increased. Doing so, however, only causes more dielectric gouging and redeposits the dielectric on the junction sidewall for stacks where the bottom electrode layer is thinner. This additional dielectric gouging increases the risk of damaging the underlying metal interconnect structure. Also, redeposited dielectric reduces the effectiveness of the clean-up etch to clean all the metal and increases the risk of shorting across the junction.

Advantageously, endpoint detection for IBE based MRAM stack patterning landing on dielectric underneath the stack is employed herein to dynamically adjust the etch time based on the incoming stack thickness. See, for example, FIGS. 1A-B which illustrate an exemplary scenario where variation is present in the bottom electrode thickness, and how dynamically adjusting the etch time compensates for that variation.

Specifically, FIG. 1A depicts the scenario where the incoming MRAM stack contains a 'thick' bottom electrode. As shown in FIG. 1A, MRAM device 100 includes memory cells 130, 140, etc. disposed on a dielectric 108. Each memory cell 130, 140, etc. includes a bottom electrode 118 disposed on dielectric 108, an MTJ 120 disposed on bottom electrode 118, and a top electrode 122 disposed on MTJ 120.

In this particular example, memory cells 130, 140, etc. are integrated with various other circuit elements. It is to be understood, however, that the present techniques are more broadly applicable to any configuration where memory cells are being fabricated on a dielectric. For instance, in this particular example, dielectric 108 is disposed over an integrated circuit structure including a substrate 102 having a dielectric 106 disposed thereon. Dielectric 108 is disposed on dielectric 106. While not shown in the figures, it is to be understood that substrate 102 can contain one or more device elements such as field-effect transistors (FETs), resistors, capacitors, etc. formed using standard complementary metal oxide semiconductor (CMOS)-compatible fabrication processes.

Electrically conductive interconnects 112 extend through dielectric 106. A barrier/adhesion layer 110 lines each of the interconnects 112. Interconnects 112 serve to connect the memory cells 130, 140, etc. to the device elements in substrate 102. As highlighted above, the IBE etch to form memory cells 130, 140, etc. lands on dielectric 108 underneath. Thus, the footprint of the interconnect needs to be smaller than the footprint of the patterned memory cells 130, 140, etc. above it. That way, dielectric 106 is exposed to either side of the interconnect.

In order to reduce the footprint of the interconnects beneath memory cells 130, 140, etc. (i.e., to ensure that the IBE lands on dielectric 108 rather than interconnect metal), an additional layer of electrically conductive interconnects 116 are employed extending through dielectric 108. A barrier/adhesion layer 114 lines each of the interconnects 116. As shown in FIG. 1A, interconnects 116 are smaller than interconnects 112 thus reducing the overall footprint of the interconnect on which the memory cells 130, 140, etc. are formed. Namely, interconnects 112 have a top width W1 and interconnects 116 have a top width W2, wherein W2<W1.

As shown in FIG. 1A, dielectric encapsulant 124 is present along the sidewalls of memory cells 130, 140, etc. Encapsulant 124 and memory cells 130, 140, etc. are buried in an interlayer dielectric (ILD) 126.

Figure 1B:
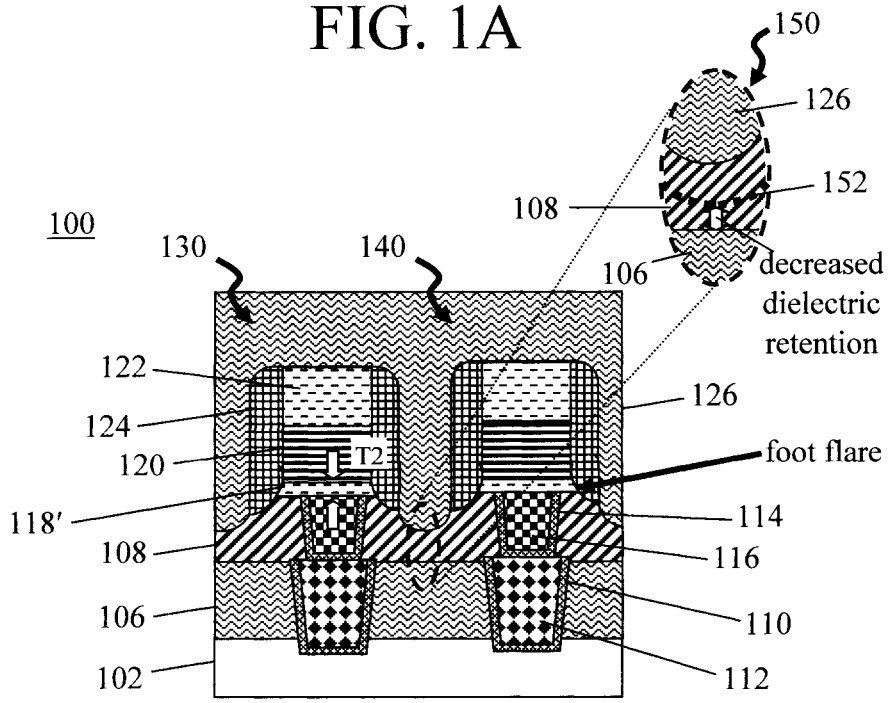
FIG. 1B is a cross-sectional diagram illustrating an exemplary MRAM device with a thin bottom electrode according to an embodiment of the present invention.

As highlighted above, FIG. 1A depicts the scenario where the incoming MRAM stack contains a 'thick' bottom electrode 118 having a thickness T1. The same MRAM device 100 is depicted in FIG. 1B with the only difference being that the incoming MRAM stack instead contains a 'thin' bottom electrode 118' having a thickness T2, wherein T1>T2. Like structures are numbered alike in the figures. However, the present techniques dynamically adjust the etch time depending on the incoming stack thickness such that these variations in bottom electrode 118/118' do not affect the outcome. For instance, comparing FIGS. 1A and 1B, it can be seen that the etch depth into dielectric 108 is consistent despite difference in the device stack thickness based on bottom electrode 118/118' thicknesses T1/T2, respectively.

By comparison, if a conventional fixed time IBE was employed, the longer etch time needed to pattern the thicker (T1) bottom electrode 118 would result in an increased gouging of dielectric 108 for stacks where the bottom electrode 118' is thinner (T2). See, for example, magnified view 150 in FIG. 1B. For illustrative purposes only, in magnified view 150 a dotted line 152 is used to indicate the decreased amount of dielectric retention that would occur if the same fixed timed IBE etch was employed on both stacks having the thicker (T1)/thinner (T2) bottom electrode 118/118'.

Further, since the MRAM stack IBE lands on dielectric, a 'foot' flare is created in the bottom electrode 118/118' at the interface with dielectric 108. However, by dynamically adjusting the etch time this foot flare is consistent despite difference in the device stack thickness based on bottom electrode 118/118' thicknesses T1/T2, respectively. See FIGS. 1A and 1B, respectively. By comparison, with a fixed time etch the foot flare size is dependent on the thickness of the incoming stack. Namely, with thicker (T1) bottom electrode 118 the foot flare would be larger and more pronounced, whereas with thinner (T2) bottom electrode 118' the foot flare would be smaller and, in some cases, non-existent.

Figure 2:
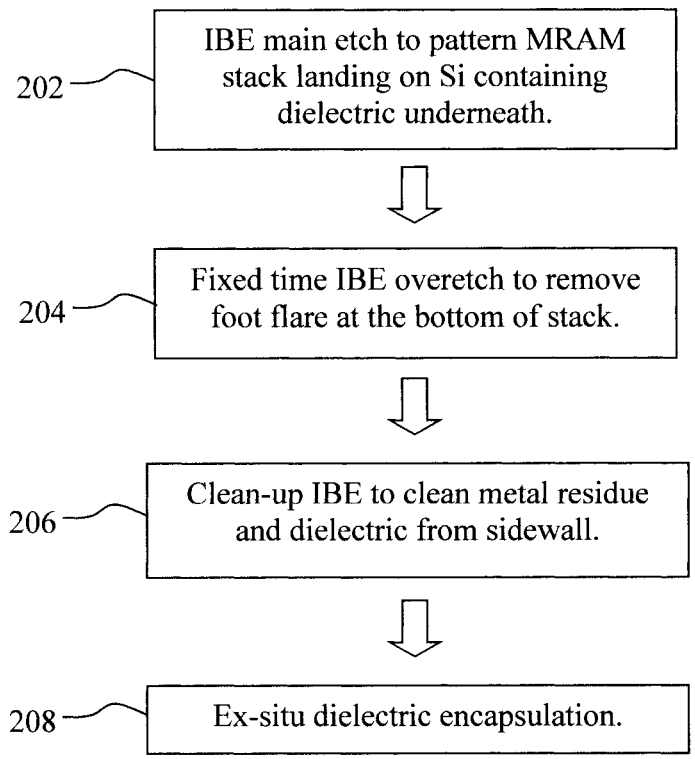
FIG. 2 is a diagram illustrating an exemplary methodology for forming an MRAM device according to an embodiment of the present invention.

An overview of the present techniques is now provided by way of reference to methodology 200 of FIG. 2. As provided above, the process begins with an MRAM stack disposed on a dielectric such as dielectric 108. In one exemplary embodiment, dielectric 108 is an Si-containing dielectric such as silicon carbonitride (SiCN(H)), silicon oxide (SiOx), silicon nitride (SiN) and/or silicon oxycarbide (SiCOH). In that case, as will be described in detail below, the optical emission wavelength of Si will be used for endpoint signal detection of the IBE etch landing on dielectric 108.

According to an exemplary embodiment, the MRAM stack includes a bottom electrode disposed on dielectric 108, an MTJ disposed on the bottom electrode, and a top electrode disposed on the MTJ. As described above, it is assumed that there is some (i.e., inter-wafer and/or intra-wafer) variation in the thickness of the incoming MRAM stack. For instance, a scenario involving varying bottom electrode thicknesses was depicted in FIGS. 1A and 1B, described above.

In step 202, an IBE etch is used to pattern the MRAM stack landing on dielectric 108 underneath the stack. This main IBE etch performed in step 202 patterns the entire MRAM stack into individual memory cells, i.e., memory cells 130, 140, etc. As provided above, this is an endpoint controlled etch step, meaning that the etch time is adjusted dynamically (e.g., using endpoint detection) to account for differences in the incoming stack thickness.

For instance, according to an exemplary embodiment, optical emission signal tracking is employed in step 202 for endpoint detection to dynamically adjust the etch time. Conventional optical emission spectroscopy systems used in commercially available IBE chambers (e.g., Lancer™ Ion Beam etch System available from Veeco Instruments, Inc. Plainview, N.Y.) can be employed in accordance with the present techniques. Namely, an optical emission signal is monitored throughout the stack IBE in step 202, and the etch is (dynamically) endpointed when a change in the optical emission signal is detected corresponding to the optical emission wavelength of Si, e.g., a wavelength of from about 250.6 nanometers (nm) to about 252.8 nm, and ranges therebetween. This signal change indicates that the IBE etch has passed through the bottom electrode and into the underlying (Si-containing) dielectric 108, since the optical emission signal for metal(s) in the bottom electrode is different from that of Si. See, e.g., FIG. 11—described below.

Since the IBE performed in step 202 lands on dielectric 108, a foot flare is created at the interface of the bottom electrode and dielectric 108 at the bottom of the memory cells 130, 140, etc. In step 204, an IBE overetch is employed to remove the foot flares at the bottom of the memory cells 130, 140, etc. According to an exemplary embodiment, this IBE overetch is performed with a fixed etch time. Namely, with patterning of the individual memory cells 130, 140, etc. completed, incoming stack thickness variations are no longer a concern.

With each etching step, metal gets redeposited along the sidewalls of memory cells 130, 140, etc. For instance, during the main stack etch (step 202), metal from the bottom electrode etch gets redeposited along the sidewalls of memory cells 130, 140, etc., including along the sidewalls of the MTJ. This redeposited metal can undesirably lead to shorts. Further, the overetch needed to remove the foot flares at the bottom of the memory cells 130, 140, etc. (step 204) also redistributes dielectric 108 along the sidewalls of the memory cells 130, 140, etc. over the redeposited metal.

Thus, in step 206 a clean-up IBE is performed to remove the redeposited metal residue and dielectric 108 from the sidewalls of memory cells 130, 140, etc. According to an exemplary embodiment, the clean-up etch is performed using a low-voltage, high angle IBE. By way of example only, a high angle denotes a beam angle (relative to the surface of the workpiece) of greater than about 60°, e.g., from about 60° to about 80° and ranges therebetween. A low voltage denotes an IBE beam voltage or energy of less than about 300 volts (V), e.g., from about 100V to about 300V and ranges therebetween.

Finally, in step 208 memory cells 130, 140, etc. are covered in a dielectric encapsulant, i.e., encapsulant 124 and ILD 126. According to an exemplary embodiment, encapsulant 124 and ILD 126 are deposited ex-situ. For instance, by way of example only, steps 202-206 are performed in-situ in an evacuated vacuum chamber (i.e., without breaking vacuum in between the steps). Following the clean-up IBE, the samples are transferred to another processing chamber in which encapsulant 124 and ILD 126 are deposited over the memory cells 130, 140, etc. (as per step 208).

Advantageously, with the present techniques the IBE main etch step (step 202) time is controlled by the endpoint signal which indicates clearing of bulk stack material. Thus, this step can compensate for incoming stack thickness variation. By comparison, conventional processes would employ a fixed time IBE main etch to pattern the stack and remove the bottom electrode foot flare, followed by a clean-up IBE to remove metal residue from the memory cell sidewalls and then dielectric encapsulation. All the etch steps would have a fixed time. Therefore, this conventional process does not compensate for any incoming stack thickness variation, and thus has significant risk of underetch or overetch related shorts.

Figure 3:
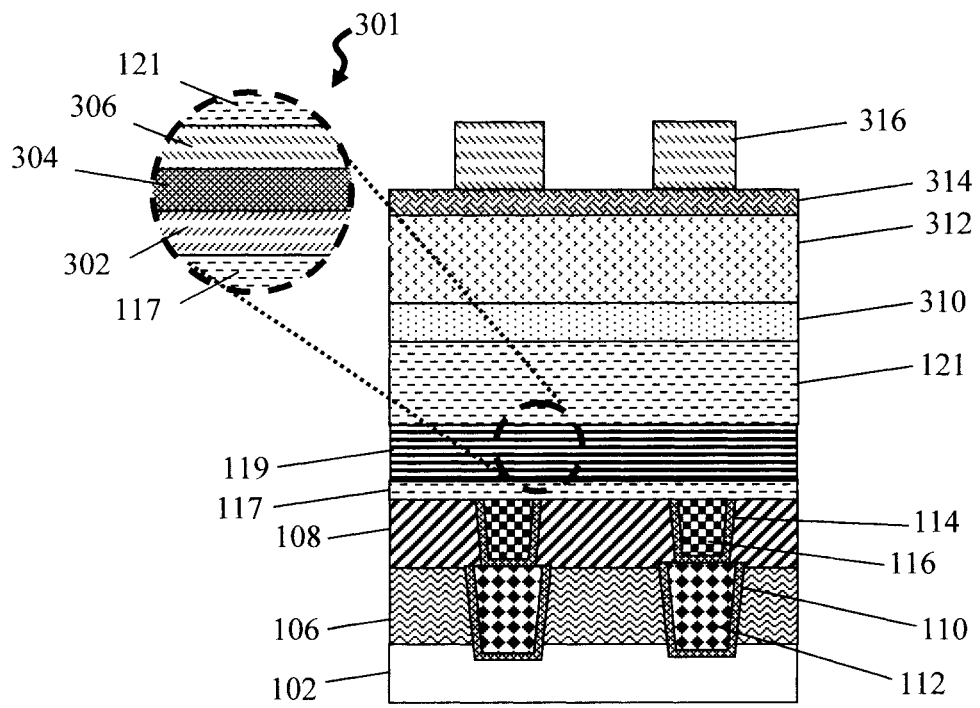
FIG. 3 is a cross-sectional diagram illustrating an MRAM stack having been formed on a dielectric substrate, and a lithographic stack having been formed on the MRAM stack according to an embodiment of the present invention.
Figure 4:
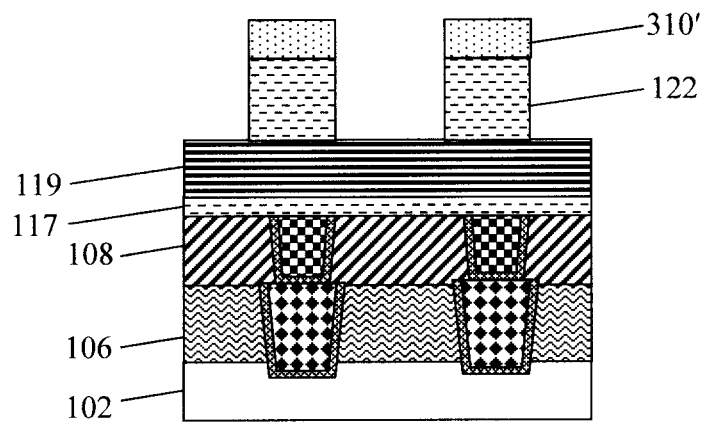
FIG. 4 is a cross-sectional diagram illustrating a hardmask of the lithographic stack having been patterned, and the pattern from the hardmask having been transferred to a top electrode layer of the MRAM stack forming individual top electrodes according to an embodiment of the present invention.
Figure 5:
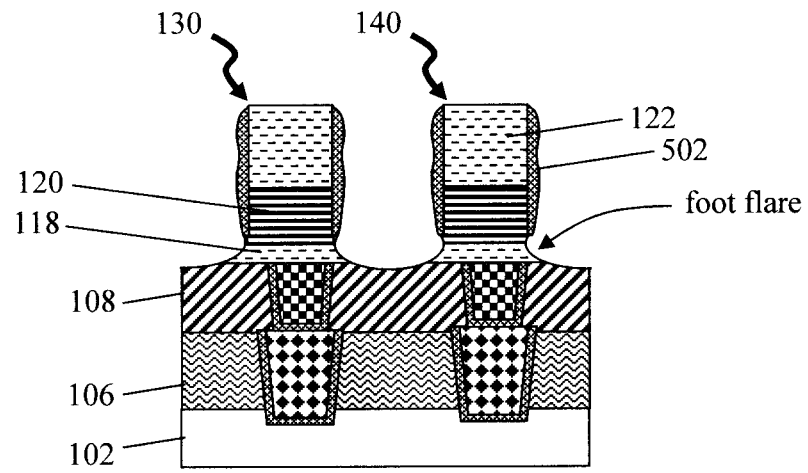
FIG. 5 is a cross-sectional diagram illustrating an IBE main etch having been used to pattern an magnetic tunnel junction (MTJ) layer and a bottom electrode layer of the MRAM stack into individual MTJs and bottom electrodes, forming memory cells, and residue that is redeposited along sidewalls of the memory cells during the IBE main etch according to an embodiment of the present invention.

An exemplary embodiment for forming an MRAM device, such as MRAM device 100, is now described by way of reference to FIGS. 3-10. As shown in FIG. 3, the process begins with a substrate 102. According to an exemplary embodiment, substrate 102 is a bulk semiconductor wafer, such as a bulk Si, bulk germanium (Ge), bulk silicon germanium (SiGe) and/or bulk III-V semiconductor wafer. Alternatively, substrate 102 can be a semiconductor-on-insulator (SOI) wafer. A SOI wafer includes a SOI layer separated from an underlying substrate by a buried insulator. When the buried insulator is an oxide it is also referred to herein as a buried oxide or BOX. The SOI layer can include any suitable semiconductor, such as Si, Ge, SiGe, and/or a III-V semiconductor. Although not shown in the figures, substrate 102 can contain one or more device elements such as FETs, resistors, capacitors, etc. formed using standard CMOS-compatible fabrication processes.

Dielectric 106 is disposed on substrate 102. Suitable materials for dielectric 106 include, but are not limited to, Si-containing dielectric such as SiCN(H), SiOx, SiN and/or SiCOH. Electrically conductive interconnects 112 extend through dielectric 106. Interconnects 112 are formed using standard metallization techniques. For instance, by way of example only, vias are first patterned in dielectric 106. Barrier/adhesion layer 110 (e.g., tantalum (Ta)/tantalum nitride (TaN)) is deposited into/lining the vias. The vias are then filled with a contact metal(s) (e.g., copper (Cu), cobalt (Co), tungsten (W), tantalum (Ta), titanium (Ti), tantalum nitride (TaN), titanium nitride (TiN), platinum (Pt), palladium (Pd), nickel (Ni) and/or gold (Au)) to form interconnects 112.

As provided above, the interconnects beneath the stack need to be smaller than the footprint of the memory cells in order for the main stack IBE etch to land on dielectric. In the present example, this is accomplished by providing another layer of electrically conductive interconnects 116, on top of interconnects 112, that have a reduced footprint (i.e., W2<W1—see FIG. 1A, above). To do so, a (second) dielectric 108 is deposited onto (first) dielectric 106. Suitable materials for dielectric 108 include, but are not limited to, Si-containing dielectric such as SiCN(H), SiOx, SiN and/or SiCOH. Standard metallization techniques are then used to form interconnects 116 in dielectric 108. For instance, by way of example only, vias are first patterned in dielectric 108. Barrier/adhesion layer 114 (e.g., Ta/TaN) is deposited into/lining the vias. The vias are then filled with a contact metal(s) (e.g., Cu, Co, W, Ta, Ti, TaN, TiN, Pt, Pd, Ni and/or Au) to form interconnects 116.

The layers of the MRAM stack are then deposited onto dielectric 108 over interconnects 116. Specifically, as shown in FIG. 3, the MRAM stack includes a bottom electrode layer 117 disposed on dielectric 108, an MTJ layer 119 disposed on bottom electrode layer 117, and a top electrode layer 121 disposed on MTJ layer 119.

Suitable materials for the bottom electrode layer 117 and the top electrode layer 121 include, but are not limited to, metals such as Cu, Co, W, Ta, Ti, TaN, TiN, Pt, Pd, Ni and/or Au. According to an exemplary embodiment, bottom electrode layer 117 has a thickness of from about 5 nanometers (nm) to about 20 nm and ranges therebetween, and the top electrode layer 121 has a thickness of from about 50 nm to about 100 nm and ranges therebetween. However, as provided above, it is anticipated that there will be some variation in the thickness of one or more layers in the stack. See, for example, the scenario depicted in FIG. 1A and FIG. 1B (described above) where the incoming stack thickness varied based on differences in thickness of the bottom electrode.

As shown in magnified view 301, MTJ layer 119 generally includes at least one fixed (or reference) layer 302 separated from at least one free layer 306 by a tunnel barrier 304. According to an exemplary embodiment, the fixed layer(s) 302 and the free layer(s) 306 are each formed from a metal such as cobalt (Co), iron (Fe), nickel (Ni), manganese (Mn), platinum (Pt), palladium (Pd), ruthenium (Ru), and combinations thereof, e.g., alloys containing at least one of the foregoing metals such as cobalt iron boron (CoFeB). According to an exemplary embodiment, tunnel barrier 304 is formed from a metal oxide such as aluminum oxide (AlOx) and/or magnesium oxide (MgO).

In order to pattern the MRAM stack into individual memory cells, a lithographic stack is formed on the MRAM stack. Namely, as shown in FIG. 3, the lithographic stack includes a hardmask 310 disposed on the MRAM stack, an organic planarizing layer (OPL) 312 disposed on the hardmask 310, an antireflective coating (ARC) 314 disposed on the OPL 312, and a patterned photoresist 316 disposed on the ARC 314 marking the footprint and location of the individual memory cells that are to be patterned in the underlying MRAM stack.

Standard lithography and etching techniques are then used to transfer the pattern from the patterned photoresist 316 to the hardmask 310, after which any remaining OPL 312, ARC 314 and patterned photoresist 316 are removed. See FIG. 4. As patterned, the hardmask is now given reference numeral 310'. IBE is then used to transfer the pattern from hardmask 310' to the top electrode layer 121 forming individual top electrodes 122. As provided above, the IBE is performed in in an evacuated vacuum chamber.

An IBE main etch using hardmask 310' is then used to pattern MTJ layer 119 and bottom electrode layer 117 into individual MTJs 120 and bottom electrodes 118, respectively, forming memory cells 130, 140, etc. See FIG. 5. As described in conjunction with the description of step 202 of methodology 200 above, the etch time of this IBE main etch is dynamically adjusted to account for variations in thickness of the incoming MRAM stack. For instance, according to an exemplary embodiment, optical emission signal tracking is used to dynamically adjust the etch time based on the detection of changes in the optical emission signal indicating that the IBE has landed on the dielectric underneath the MRAM stack. For instance, as provided above, dielectric 108 beneath the MRAM stack can be an Si-containing dielectric material. As such, one can monitor the optical emission signal during the IBE main etch, and endpoint the etch whenever a change in the optical emission signal is detected corresponding to the optical emission wavelength of Si, e.g., a wavelength range of from about 250.6 nm to about 252.8 nm, and ranges therebetween. Of course, this endpoint will vary depending on the stack thickness since the IBE etch will take a relatively longer time to reach dielectric 108 with a thicker MRAM stack than with a thinner stack, and vice versa. See, e.g., FIG. 12—described below.

Advantageously, more precisely endpointing the IBE main etch minimizes the amount of gouging of dielectric 108 (see above) as well as the amount of metal and dielectric residue (from the MTJ/bottom electrode etch) that gets redeposited along the sidewalls of memory cells 130, 140, etc. Nonetheless, the redeposition of some metal residue 502 along the sidewalls is inevitable. See FIG. 5. This residue 502 will be removed during the clean-up IBE later in the process.

Figure 6:
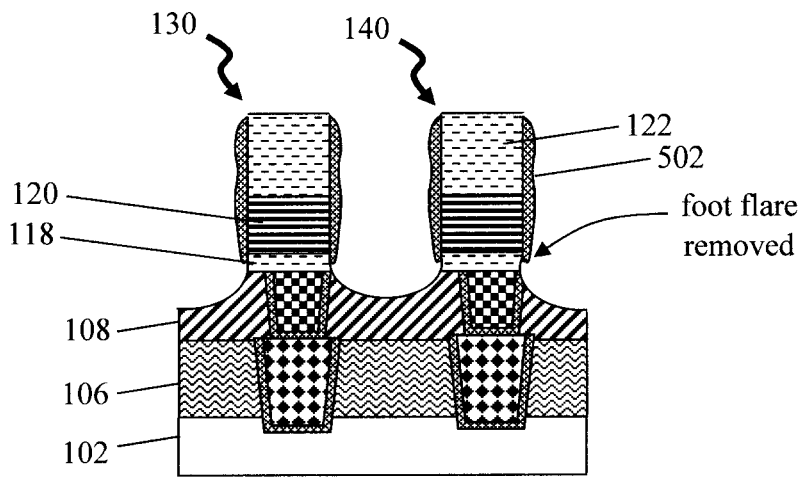
FIG. 6 is a cross-sectional diagram illustrating an IBE overetch having been used to remove foot flare from the bottom electrodes of the memory cells according to an embodiment of the present invention.
Figure 7:
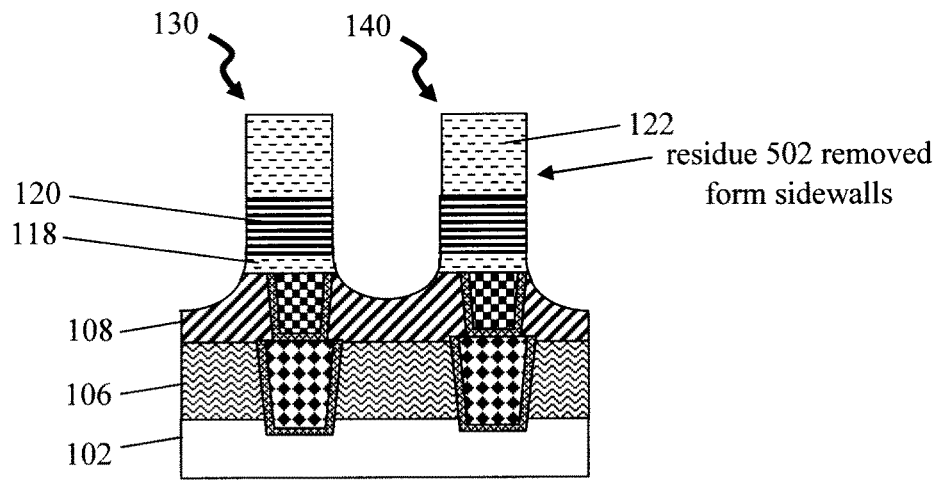
FIG. 7 is a cross-sectional diagram illustrating a clean-up IBE having been used to remove the residue from the sidewalls of the memory cells according to an embodiment of the present invention.

Since the IBE main etch lands on dielectric 108, a foot flare is created at the base of bottom electrodes 118. As described in conjunction with the description of step 204 of methodology 200 above, an IBE overetch is next employed to remove these foot flares. See FIG. 6. According to an exemplary embodiment, the IBE overetch is performed with a fixed etch time since the bulk stack material has already been cleared during the IBE main etch, and thus incoming stack thickness variations are no longer a concern. As shown in FIG. 6, a further amount of the dielectric 108 is removed during this process. However, much of dielectric 108 was retained during the IBE main etch due to the precise endpointing of the etch (i.e., via optical emission signal tracking). The IBE to remove the foot flares can also redeposit more metal (and dielectric 108) onto the metal residue 502 along the sidewalls of memory cells 130, 140, etc.

As described in conjunction with the description of step 206 of methodology 200 above, a clean-up IBE is performed to remove the metal residue 502 and dielectric 108 from the sidewalls of memory cells 130, 140, etc. See FIG. 7. According to an exemplary embodiment, the clean-up etch is performed using a low-voltage (i.e., less than about 300V, e.g., from about 100V to about 300V and ranges therebetween), high angle (i.e., greater than about 60°, e.g., from about 60° to about 80° and ranges therebetween) IBE.

Figure 8:
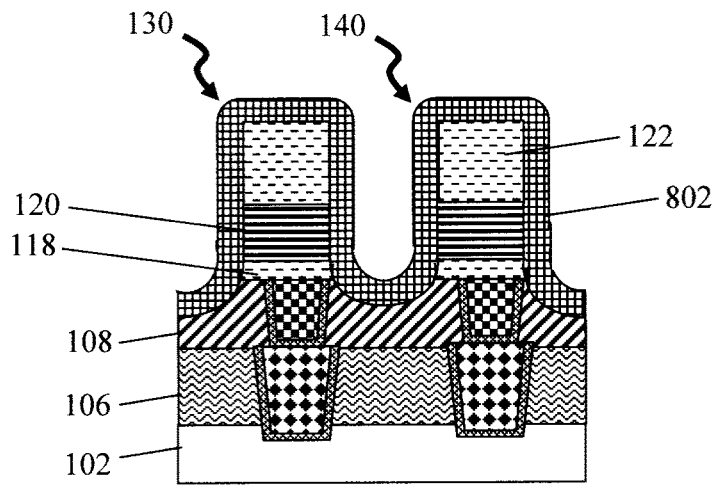
FIG. 8 is a cross-sectional diagram illustrating a conformal dielectric having been deposited over the memory cells and the exposed surfaces of the dielectric according to an embodiment of the present invention.

As described in conjunction with the description of step 208 of methodology 200 above, memory cells 130, 140, etc. are then covered in a dielectric encapsulant, i.e., encapsulant 124 and ILD 126. For instance, as shown in FIG. 8, a conformal dielectric 802 is deposited over memory cells 130, 140, etc. and the exposed surfaces of dielectric 108.

According to an exemplary embodiment, the etch steps including, but not limited to, the IBE main etch, the IBE overetch to remove the foot flares and the clean-up IBE are all performed, in situ, in the same evacuated vacuum chamber without breaking vacuum between each of those steps. However, the workpiece is now removed from the vacuum chamber to deposit conformal dielectric 802 ex-situ. Conformal dielectric 802 can be deposited using a process such as plasma enhanced chemical vapor deposition (PECVD) or physical vapor deposition (PVD). Suitable materials for conformal dielectric 802 include, but are not limited to, SiCN(H), SiOx, SiN and/or SiCOH.

Figure 9:
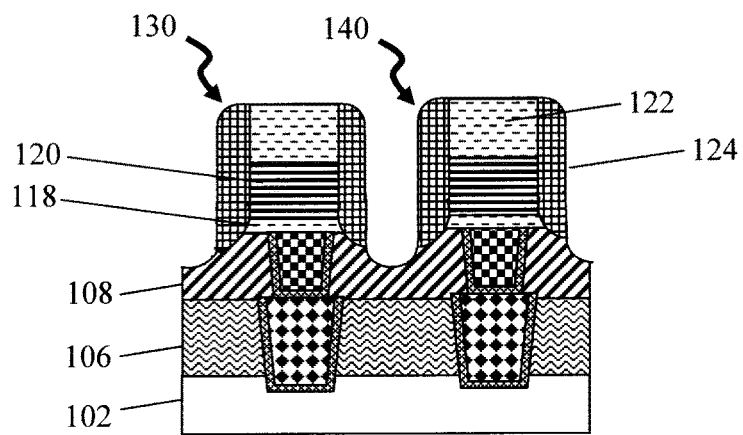
FIG. 9 is a cross-sectional diagram illustrating an etch-back of conformal dielectric having been performed to form an encapsulant along the sidewalls of the memory cells according to an embodiment of the present invention.

An etchback of conformal dielectric 802 is then performed which removes conformal dielectric 802 from all horizontal surfaces including the horizontal surfaces of memory cells 130, 140, etc. and dielectric 108. See FIG. 9. As shown in FIG. 9, what remains of conformal dielectric 802 forms encapsulant 124 along the sidewalls of memory cells 130, 140, etc. According to an exemplary embodiment, the etchback is performed using a directional (anisotropic) etching process such as reactive ion etching (RIE). Some recessing of the top electrodes 122 and dielectric 108 occurs during the etchback. See FIG. 9.

Figure 10:
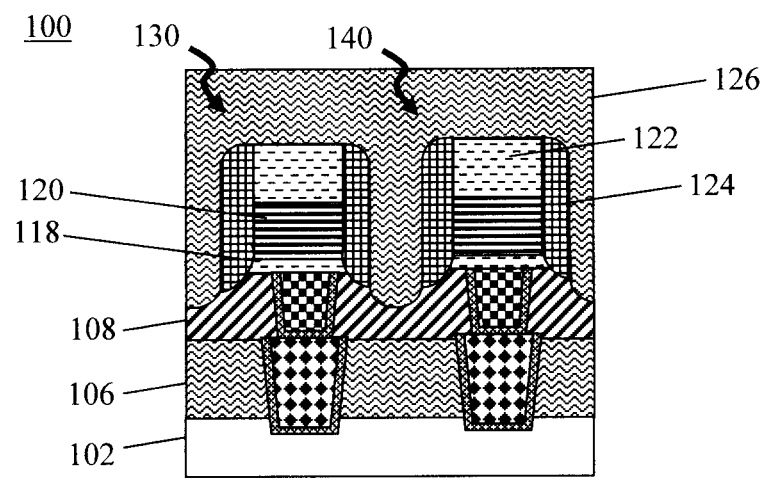
FIG. 10 is a cross-sectional diagram illustrating the memory cells having been buried in an interlayer dielectric (ILD) according to an embodiment of the present invention.

Memory cells 130, 140, etc. are then buried in ILD 126. See FIG. 10. Suitable materials for ILD 126 include, but are not limited to, SiCN(H), SiOx and/or SiCOH. ILD 126 can be deposited using a process such as CVD or PVD, followed by planarization process such as chemical mechanical polishing (CMP). As shown in FIG. 10, the result is MRAM device 100 having memory cells 130, 140, etc. encapsulated in dielectric (i.e., encapsulant 124 and ILD 126).

Figure 11:
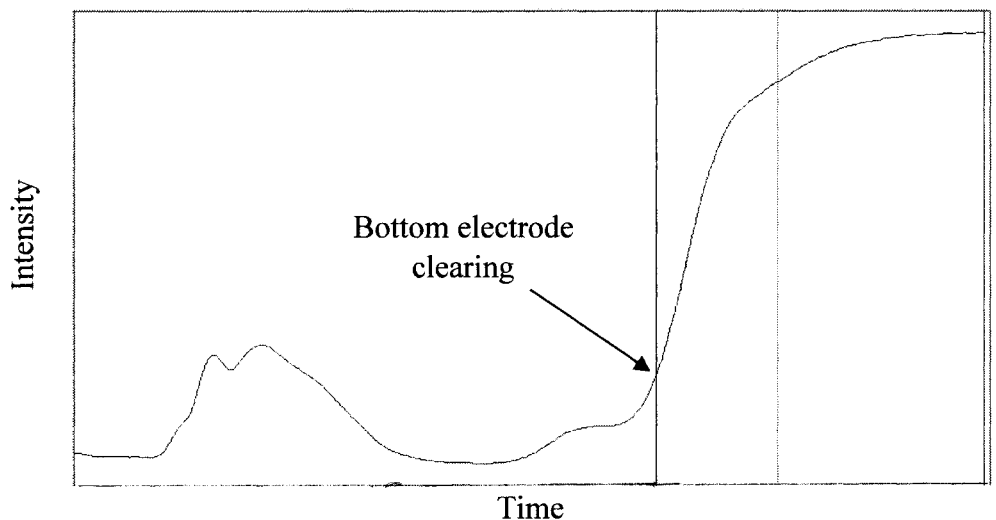
FIG. 11 is a diagram illustrating an exemplary optical emission signal trace showing the optical emission signal change after the bottom electrode has been cleared according to an embodiment of the present invention.

As described above, optical emission signal tracking can be employed in accordance with the present techniques, whereby the optical emission signal is monitored throughout the stack IBE, and the etch is (dynamically) endpointed when a change in the optical emission signal is detected corresponding to the optical emission wavelength of Si (i.e., indicating that the IBE etch has passed through the bottom electrode and into the underlying (Si-containing) dielectric. FIG. 11 is a diagram illustrating an exemplary emission signal trace showing the signal change after the bottom electrode has been cleared.

Figure 12:
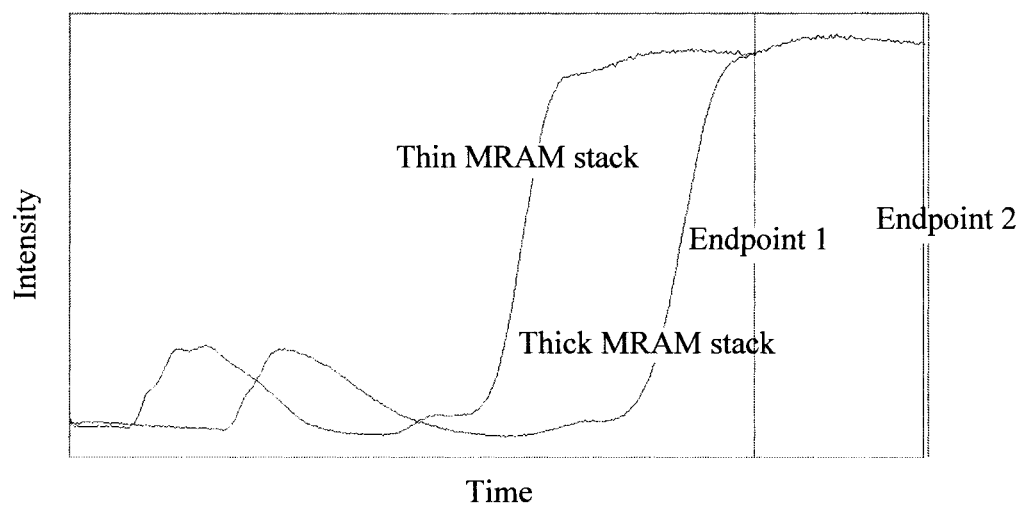
FIG. 12 is a diagram illustrating an exemplary optical emission signal traces for two different stack thicknesses according to an embodiment of the present invention.

Further, as provided above, the endpoint will vary depending on the stack thickness since the IBE etch will take a relatively longer time to reach the underlying dielectric with a thicker MRAM stack than with a thinner MRAM stack, and vice versa. See, for example, FIG. 12 which is a diagram illustrating exemplary emission signal traces for two different stack thicknesses. As indicated in FIG. 12, the emission signal shows different endpoints (i.e., Endpoint 1 and Endpoint 2) for different thicknesses.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a magnetic random access memory (MRAM) device, the method comprising:
    patterning an MRAM stack disposed on a dielectric into individual memory cells using ion beam etching (IBE) landing on the dielectric while endpoint detection is used for dynamically adjusting an etch time to compensate for variations in a thickness of the MRAM stack, wherein each of the memory cells as-patterned comprises a bottom electrode disposed on the dielectric, a magnetic tunnel junction (MTJ) disposed on the bottom electrode, and a top electrode disposed on the MTJ;
    removing foot flares from the bottom electrode of the memory cells, wherein the foot flares are created during the patterning of the MRAM stack;
    removing residue from sidewalls of the memory cells, wherein the residue comprises metal redeposited during the patterning of the MRAM stack and during the removing of the foot flares; and
    covering the memory cells in a dielectric encapsulant.

2. The method of claim 1, further comprising:
    monitoring an optical emission signal while the MRAM stack is being patterned.

3. The method of claim 1, wherein the dielectric comprises a silicon (Si)-containing dielectric.

4. The method of claim 3, wherein the Si-containing dielectric is selected from the group consisting of: silicon carbonitride (SiCN(H)), silicon oxide (SiOx), silicon nitride (SiN), silicon oxycarbide (SiCOH), and combinations thereof.

5. The method of claim 3, further comprising:
    monitoring an optical emission signal while the MRAM stack is being patterned; and
    endpointing the IBE when a change in the optical emission signal is detected corresponding to an optical emission wavelength of Si.

6. The method of claim 5, wherein the optical emission wavelength of Si is from about 250.6 nm to about 252.8 nm, and ranges therebetween.

7. The method of claim 1, wherein the foot flares are removed from the bottom electrode of the memory cells using an IBE overetch.

8. The method of claim 7, wherein the IBE overetch is performed using a fixed etch time.

9. The method of claim 1, wherein the residue is removed from the sidewalls of the memory cells using a clean-up IBE.

10. The method of claim 1, further comprising:
depositing a conformal dielectric over the memory cells;
etching back the conformal dielectric to form an encapsulant along the sidewalls of the memory cells; and
burying the memory cells in an interlayer dielectric (ILD), wherein the encapsulant and the ILD form the dielectric encapsulant covering the memory cells.

11. The method of claim 10, wherein the conformal dielectric and the ILD each comprises a material selected from the group consisting of: SiCN(H), SiOx, SiN, SiCOH, and combinations thereof.

12. A method of forming an MRAM device, the method comprising:
patterning an MRAM stack disposed on an Si-containing dielectric into individual memory cells using IBE landing on the Si-containing dielectric while dynamically adjusting an etch time to compensate for variations in a thickness of the MRAM stack by monitoring an optical emission signal while the MRAM stack is being patterned, and endpointing the IBE when a change in the optical emission signal is detected corresponding to an optical emission wavelength of Si, wherein each of the memory cells as-patterned comprises a bottom electrode disposed on the Si-containing dielectric, an MTJ disposed on the bottom electrode, and a top electrode disposed on the MTJ;
removing foot flares from the bottom electrode of the memory cells, wherein the foot flares are created during the patterning of the MRAM stack;
removing residue from sidewalls of the memory cells, wherein the residue comprises metal redeposited during the patterning of the MRAM stack and during the removing of the foot flares; and
covering the memory cells in a dielectric encapsulant.

13. The method of claim 12, wherein the Si-containing dielectric is selected from the group consisting of: SiCN(H), SiOx, SiN, SiCOH, and combinations thereof.

14. The method of claim 12, wherein the optical emission wavelength of Si is from about 250.6 nm to about 252.8 nm, and ranges therebetween.

15. The method of claim 12, further comprising:
depositing a conformal dielectric over the memory cells;
etching back the conformal dielectric to form an encapsulant along the sidewalls of the memory cells; and
burying the memory cells in an ILD, wherein the encapsulant and the ILD form the dielectric encapsulant covering the memory cells.

* * * * *